(12) United States Patent
Aoki et al.

(10) Patent No.: US 11,337,336 B2
(45) Date of Patent: May 17, 2022

(54) COOLING DEVICE

(71) Applicant: Furukawa Electric Co., Ltd., Tokyo (JP)

(72) Inventors: Hirofumi Aoki, Tokyo (JP); Yoshikatsu Inagaki, Tokyo (JP); Kenya Kawabata, Tokyo (JP); Yoshinori Nakamura, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 17/357,797

(22) Filed: Jun. 24, 2021

(65) Prior Publication Data
US 2021/0321538 A1 Oct. 14, 2021

Related U.S. Application Data

(63) Continuation of application No. PCT/JP2020/014737, filed on Mar. 31, 2020.

(30) Foreign Application Priority Data

Apr. 11, 2019 (JP) .............................. JP2019-075861

(51) Int. Cl.
*H05K 7/20* (2006.01)
(52) U.S. Cl.
CPC ..... *H05K 7/20318* (2013.01); *H05K 7/20327* (2013.01)
(58) Field of Classification Search
CPC ......... F28D 15/0266; F28D 2015/0216; H01L 23/427; H01L 2023/4068;
(Continued)

(56) References Cited

U.S. PATENT DOCUMENTS

2006/0196640 A1 9/2006 Siu
2010/0018678 A1 1/2010 Siu
(Continued)

FOREIGN PATENT DOCUMENTS

CN 102342191 A 2/2012
JP H0632409 B2 4/1994
(Continued)

OTHER PUBLICATIONS

English Translation of Notification of Reasons for refusal dated Jul. 22, 2019 for Japanese application No. 2019-075861.
(Continued)

*Primary Examiner* — Mandeep S Buttar
(74) *Attorney, Agent, or Firm* — Dorsey & Whitney LLP

(57) ABSTRACT

A cooling device including a container to which at least one heating element is thermally connected, a primary refrigerant, and a condensation tube through which a secondary refrigerant flows, wherein a container inner surface area increasing portion is formed on an inner surface of the container to which the heating element is thermally connected, and a plate-shaped member is provided, that includes a shielding portion that is located above the container inner surface area increasing portion in a direction of gravity and below the condensation tube in the direction of gravity, with at least a part of the shielding portion not immersed in the primary refrigerant in a liquid phase, and the plate-shaped member includes a support portion extending from the shielding portion, in a part of a periphery along an orthogonal direction to the direction of gravity, of the container inner surface area increasing portion.

9 Claims, 8 Drawing Sheets

(58) Field of Classification Search
CPC ......... H01L 2924/0002; H01L 2924/00; H01L 23/473; H05K 7/20; H05K 7/20318; H05K 7/20309; H05K 7/20936; H05K 7/20236; H05K 7/20263; H05K 7/20327; H05K 7/2029; G06F 1/20; G06F 2200/201; G06F 1/206; F28F 3/02; F28F 13/06; F28F 3/025
USPC ...... 361/700, 699; 165/104.33, 104.21, 80.4, 165/168, 170; 257/23.088, 715, 718, 722, 257/E23.103
See application file for complete search history.

(56) References Cited

U.S. PATENT DOCUMENTS

| | | |
|---|---|---|
| 2010/0328889 A1 | 12/2010 | Campbell et al. |
| 2012/0175094 A1* | 7/2012 | Rice .................. F28D 1/03 165/170 |
| 2013/0056178 A1 | 3/2013 | Matsunaga et al. |
| 2013/0105122 A1 | 5/2013 | Campbell et al. |
| 2014/0071627 A1* | 3/2014 | Campbell ............ F28D 15/046 361/700 |
| 2015/0109735 A1 | 4/2015 | Campbell et al. |
| 2016/0073548 A1 | 3/2016 | Wei et al. |

FOREIGN PATENT DOCUMENTS

| | | | |
|---|---|---|---|
| JP | 2008522129 A | | 6/2008 |
| JP | 2008227150 A | | 9/2008 |
| JP | 2010010204 A | | 1/2010 |
| JP | 2012247166 A | | 12/2012 |
| JP | 2014127539 A | | 7/2014 |
| JP | 2015197245 A | * | 11/2015 |
| JP | 2015197245 A | | 11/2015 |
| JP | 2016054248 A | | 4/2016 |
| WO | 2011145618 A1 | | 11/2011 |

OTHER PUBLICATIONS

International Search Report and Written Opinion received in PCT Application No. PCT/JP2020/014737 dated Jul. 7, 2020 (Engl. translation of ISR only).

English Translation of 1st Office Action dated Jun. 21, 2020 received in TW Application No. 109112150.

English Translation of Written Opinion received in PCT Application No. PCT/JP2020/014737 dated Jul. 7, 2020.

English translation of International Preliminary Report on Patentability Chapter I received in PCT Application No. PCT/JP2020/014737 dated Oct. 21, 2021.

* cited by examiner

COOLING DEVICE

CROSS REFERENCE TO RELATED APPLICATIONS

The present application is a continuation application of International Patent Application No. PCT/JP2020/014737 filed on Mar. 31, 2020, which claims the benefit of Japanese Patent Application No. 2019-075861, filed on Apr. 11, 2019. The contents of these applications are incorporated herein by reference in their entirety.

BACKGROUND

Technical Field

The present disclosure relates to a cooling device that cools heating elements such as electric/electronic components and the like, and particularly relates to a cooling device that can cool electric/electronic components and the like having a large heat generation amount to a predetermined allowable temperature without increasing a size of the cooling device.

Background

With the advancement of functions of electronic devices, heating elements such as electric/electronic components are mounted at high density inside the electronic devices, and the heat generation amount of the heating elements is increasing. If the temperature of the heating element such as electric/electronic components rises above the predetermined allowable temperature, it becomes the cause of malfunctioning of the electric/electronic components and the like, and therefore it is important to keep the temperature of the heating elements such as electric/electronic components at the allowable temperature or less. Therefore, a cooling device for cooling electric/electronic components and the like is mounted inside the electronic device.

On the other hand, since the heating elements such as electric/electronic components are mounted at a high density as described above, the space in which the cooling device can be installed is limited. Therefore, the cooling device is required to further improve the cooling characteristics while avoiding an increase in size.

As the cooling device for stably cooling even the electric/electronic components and the like that are increased in heat generation amount, there is proposed a cooling device having a primary refrigerant stored in a container, and a secondary refrigerant that flows through a condensation tube stored in the container, and is incompatible with the primary refrigerant, wherein a region storing the primary refrigerant is a heat absorption region that absorbs heat of a heating element, a region storing the secondary refrigerant is a heat radiation region that radiates heat to outside, the primary refrigerant is vaporized and moves to the heat radiation region to be cooled and condensed in the heat radiation region, and thereby heat moves from the heat absorption region to the heat radiation region (Japanese Patent Laid-open No. 2012-247166). Further, in Japanese Patent Laid-open No. 2012-247166, it is proposed to provide a rising guide member that guides the primary refrigerant vaporized in the heat absorption region to a rising flow path, and a lowering guide member that guides the primary refrigerant condensed in the radiation region to a lowering flow path. By providing the above described guide members, a flow of the primary refrigerant in a liquid phase and a flow of the primary refrigerant in a gaseous phase that are in a counter flow relation are separated to improve cooling performance.

On one hand, from a viewpoint of further compactification of the cooling device, it may be required to reduce a dimension in a height direction of the container. However, in the cooling device of Japanese Patent Laid-open No. 2012-247166, droplets of the primary refrigerant may be scattered within the container when the primary refrigerant receiving heat from the heating element boils. When the droplets of the primary refrigerant are scattered within the container, the droplets of the primary refrigerant adhere to the condensation tube stored in the container, and condensation efficiency of the primary refrigerant by the condensation tube declines. Therefore, from a viewpoint of the condensation efficiency of the primary refrigerant by the condensation tube, there is room to improve the cooling performance of the cooling device.

Further, in Japanese Patent Laid-open No. 2012-247166, the primary refrigerant changes in phase from a gaseous phase to a liquid phase by the cooling function of the condensation tube provided at a predetermined space or more from the liquid surface of the primary refrigerant, and therefore when the heat generation amount of the heating element increases, a back flow of the primary refrigerant in a liquid phase from a condensation tube outer surface may be insufficient. Further, the primary refrigerant that receives heat from the heating element may be insufficient because the droplets of the primary refrigerant are scattered within the container as describe above. As a result of these events, there is a fear that the primary refrigerant dries out. Accordingly, there is room to improve the cooling performance of the cooling device by preventing the primary refrigerant from drying out.

SUMMARY

In view of the above described circumstances, it is an object of the present disclosure to provide a cooling device that can prevent droplets of a primary refrigerant sealed in a container from adhering to a condensation tube in an inside of the container even when the cooling device is compactified, and can prevent the primary refrigerant in a liquid phase from drying out.

A gist of a configuration of a cooling device of the present disclosure is as follows.

[1] A cooling device including a container to which at least one heating element is thermally connected, a primary refrigerant that is sealed in an inside of the container, and a condensation tube through which a secondary refrigerant flows, and which penetrates through a gaseous phase portion in the inside of the container, wherein the heating element is thermally connected to a part where the primary refrigerant in a liquid phase exists or a vicinity of the part where the primary refrigerant in a liquid phase exists, of an outer surface of the container, a container inner surface area increasing portion that increases a contact area with the primary refrigerant in a liquid phase is formed on an inner surface of the container to which the heating element is thermally connected, and at least a part of the container inner surface area increasing portion is immersed in the primary refrigerant in a liquid phase, and a plate-shaped member is provided, that includes a shielding portion that is located above the container inner surface area increasing portion in a direction of gravity and below the condensation tube in the direction of gravity, with at least a part of the shielding portion not immersed in the primary refrigerant in a liquid phase.

[2] The cooling device according to [1], wherein the container inner surface area increasing portion is a plurality of plate-shaped fins.

[3] The cooling device according to [1] or [2], wherein the plate-shaped member includes a support portion extending from the shielding portion, in a part of a periphery along an orthogonal direction to the direction of gravity, of the container inner surface area increasing portion.

[4] The cooling device according to any one of [1] to [3], wherein the shielding portion includes a protruded portion protruded above in the direction of gravity.

[5] The cooling device according to [3] or [4], wherein the support portion is integrated with the container inner surface or the container inner surface area increasing portion.

[6] The cooling device according to any one of [3] to [5], wherein the support portion is sandwiched by the plate-shaped fins.

[7] The cooling device according to any one of [3] to [6], wherein the shielding portion includes a shielding portion extension part extended toward a direction of the inner surface of the container from the support portion.

[8] The cooling device according to any one of [3] to [6], wherein the support portion includes a first extension part extended toward a direction of the inner surface of the container from the shielding portion.

[9] The cooling device according to any one of [3] to [6], wherein the support portion includes a second extension part extended above the shielding portion in the direction of gravity.

[10] The cooling device according to any one of [2] to [9], wherein a ratio of a distance from a tip end of the plate-shaped fin to a surface at a lower side in the direction of gravity, of the shielding portion to a height of the plate-shaped fins is 0 or more and 4.0 or less.

[11] The cooling device according to [1] or [2], wherein the shielding portion includes a bent portion bent in the direction of gravity, the bent portion is in contact with the container inner surface area increasing portion, and an edge portion of the shielding portion is in contact with the condensation tube.

[12] The cooling device according to any one of [1] to [11], wherein more than the one shielding portion is provided along an upper side in the direction of gravity.

[13] The cooling device according to any one of [1] to [12], wherein the shielding portion includes a region that overlaps the heating element in plan view.

[14] The cooling device according to any one of [2] to [13], wherein a ratio of a width of the shielding portion to a width of the plate-shaped fins is 0.3 or more and 1.5 or less.

In an aspect of the cooling device of the above described [1], the primary refrigerant sealed in the inside of the container changes in phase from a liquid phase to a gaseous phase by receiving heat from the heating element, the primary refrigerant that changes in phase to the gaseous phase changes in phase to a liquid phase from the gaseous phase to a liquid phase by the condensation tube through which the secondary refrigerant flows, and which penetrates through the gaseous phase portion in the inside of the container, and latent heat released from the primary refrigerant at the time of the phase change is transferred to the secondary refrigerant flowing through the condensation tube. The secondary refrigerant receiving the latent heat from the primary refrigerant flows through the condensation tube to the outside from the inside of the cooling device, and thereby the latent heat is transported to the outside of the cooling device. The secondary refrigerant receiving the latent heat is cooled in a secondary refrigerant cooling portion provided in the outside of the cooling device. Further, since the plate-shaped member provided above the container inner surface area increasing portion in the direction of gravity includes the shielding portion with at least a part of the shielding portion not immersed in the primary refrigerant in a liquid phase, at least the part of the shielding portion of the plate-shaped member is located in the gaseous phase portion in the inside of the container.

Note that in the present description, "plan view" means a state of visual recognition from above in the direction of gravity.

According to an aspect of the cooling device of the present disclosure, the plate-shaped member including the shielding portion that is located above the container inner surface area increasing portion in the direction of gravity and below the condensation tube in the direction of gravity, and is not immersed in the primary refrigerant in a liquid phase is provided, and thereby it is possible to prevent droplets of the primary refrigerant from adhering to the condensation tube even when the primary refrigerant boils, even when compactifying the cooling device. Accordingly, even when compactifying the cooling device, it is possible to prevent decline of the condensation efficiency of the primary refrigerant by the condensation tube, and excellent cooling performance is obtained.

Further, according to an aspect of the cooling device of the present disclosure, the primary refrigerant changing in phase from a gaseous phase to a liquid phase by the cooling action of the condensation tube drops to the shielding portion of the plate-shaped member from the outer surface of the condensation tube and the shielding portion of the plate-shaped member is cooled, whereby the shielding portion of the plate-shaped member can contribute to condensation of the primary refrigerant in a gaseous phase, and the primary refrigerant in a liquid phase can smoothly flow back to the container inner surface area increasing portion. Further, the shieling portion of the plate-shaped member restrains the droplets of the primary refrigerant from scattering within the container, and thereby it is possible to prevent the primary refrigerant that receives heat from the heating element from being insufficient. Accordingly, even when the heat generation amount of the heating element increases, it is possible to prevent the primary refrigerant in a liquid phase from drying out, and excellent cooling performance is obtained.

Further, according to an aspect of the cooling device of the present disclosure, the shielding portion of the plate-shaped member can contribute to condensation of the primary refrigerant in a gaseous phase, and therefore even when the heat generation amount of the heating element increases, it is possible to operate the cooling device smoothly without augmenting the condensation tube.

According to an aspect of the cooling device of the present disclosure, the plate-shaped member includes the support portion at a part of the periphery of the container inner surface area increasing portion, and thereby even when the primary refrigerant boils and the liquid surface of the primary refrigerant swells, the primary refrigerant is returned to a position of the container inner surface area increasing portion, so that it is possible to immerse the container inner surface area increasing portion in the primary refrigerant reliably. Further, since the plate-shaped member includes the support portion at a part of the periphery of the container inner surface area increasing portion, the shielding portion of the plate-shaped member is reliably fixed to the inside of the container.

According to an aspect of the cooling device of the present disclosure, the shieling portion includes the protruded portion protruded above in the direction of gravity, and therefore by locating the protruded portion in the region where the primary refrigerant is easily vaporized, the primary refrigerant in a gaseous phase can smoothly flow to a direction of the condensation tube from a side below the shielding portion in the direction of gravity.

According to an aspect of the cooling device of the present disclosure, the support portion is integrated with the container inner surface or the container inner surface area increasing portion, and thereby fixed stability of the plate-shaped member is improved.

According to an aspect of the cooling device of the present disclosure, the support portion is sandwiched by the plate-shaped fins of the container inner surface area increasing portion, and thereby it is possible to obtain the fixed stability of the plate-shaped member easily.

According to an aspect of the cooling device of the present disclosure, the shielding portion includes the shielding portion extension part that is extended toward the direction of the inner surface of the container from the support portion, and thereby it is possible to prevent the droplets of the primary refrigerant from adhering to the condensation tube reliably even when a boiling region of the primary refrigerant enlarges.

According to an aspect of the cooling device of the present disclosure, the support portion includes the first extension part that is extended toward the direction of the inner surface of the container from the shielding portion, and thereby the primary refrigerant in a liquid phase can smoothly flow to the container inner surface area increasing portion.

According to an aspect of the cooling device of the present disclosure, the support portion includes the second extension part that is extended above the shielding portion in the direction of gravity, and thereby the primary refrigerant in a liquid phase that is condensed on the outer surface of the condensation tube more reliably flows back to the container inner surface area increasing portion.

According to an aspect of the cooling device of the present disclosure, the bent portion of the shielding portion, which is bent in the direction of gravity, is in contact with the container inner surface area increasing portion, and the edge portion of the shielding portion is in contact with the condensation tube, whereby it is possible to obtain the fixed stability of the shielding portion of the plate-shaped member easily.

DETAILED DESCRIPTION

Figure 1:
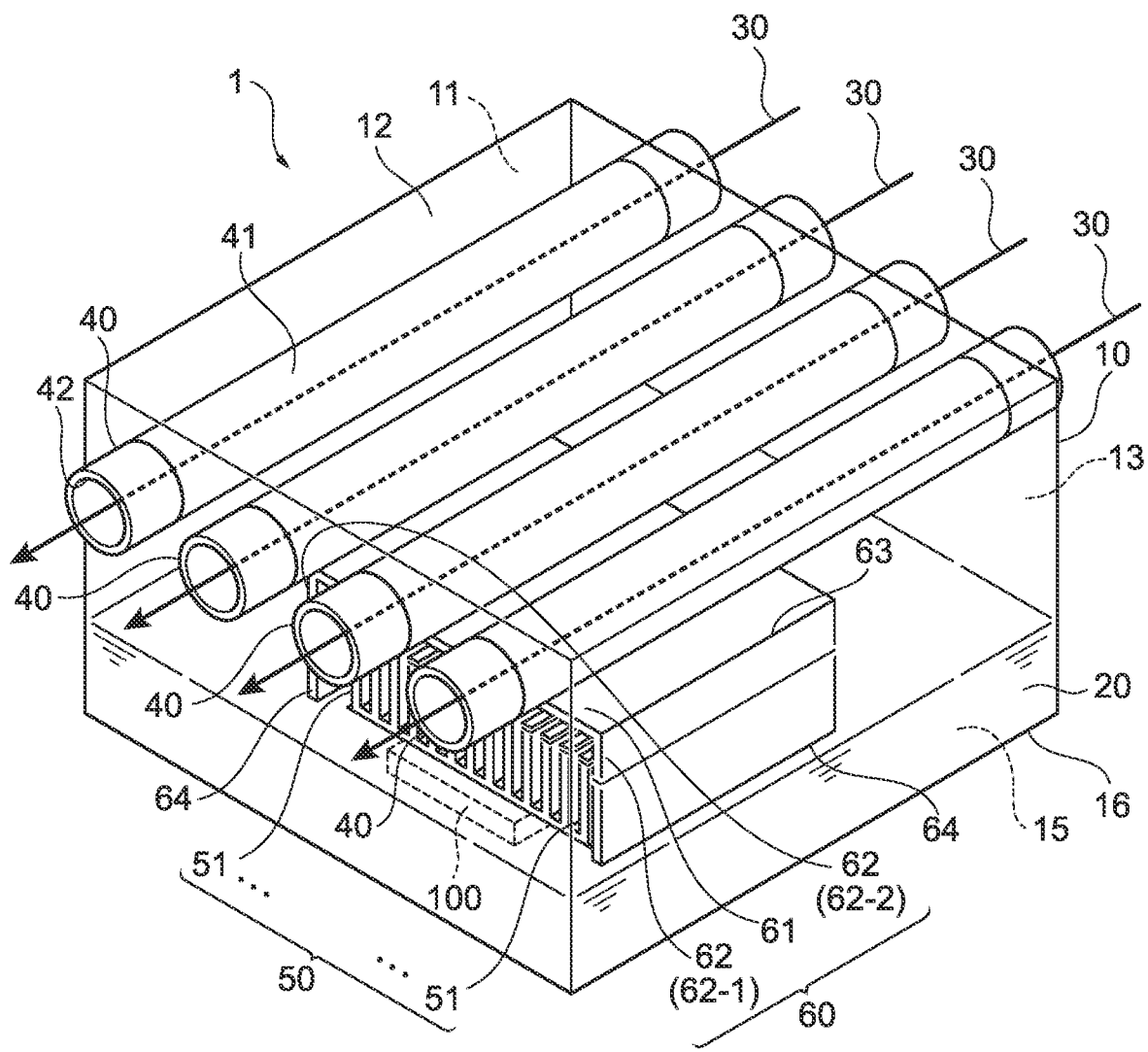
FIG. 1 is a perspective view explaining an outline of a cooling device according to a first embodiment of the present disclosure.
Figure 2:
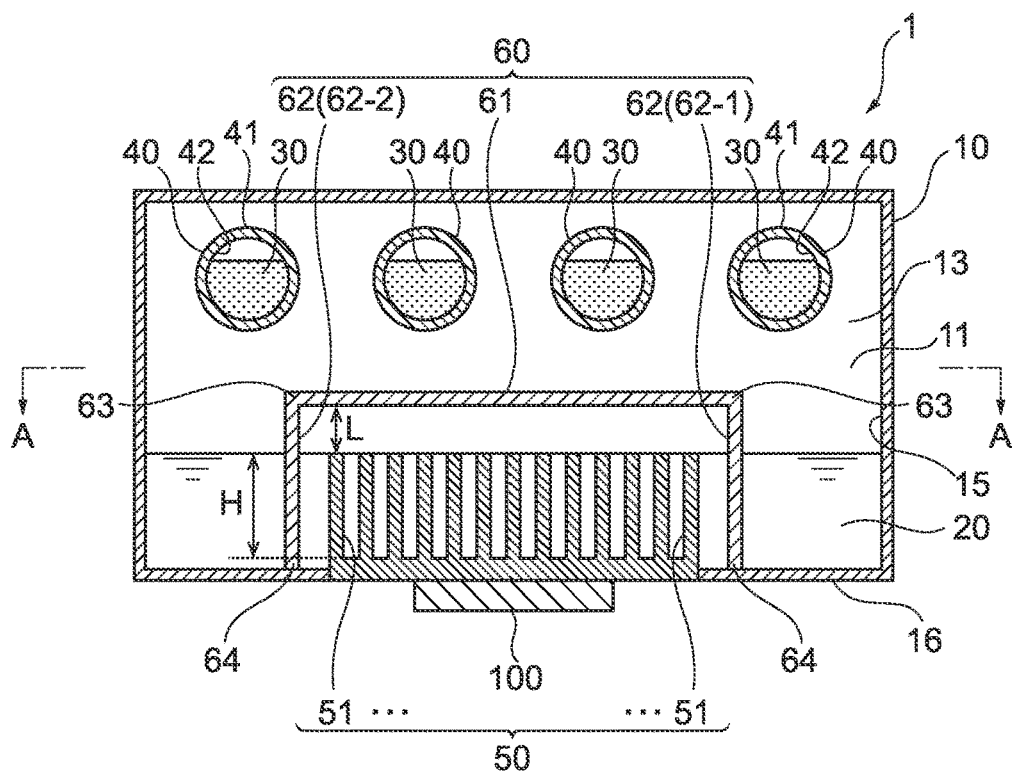
FIG. 2 is a sectional side view explaining the outline of the cooling device according to the first embodiment of the present disclosure.
Figure 3:
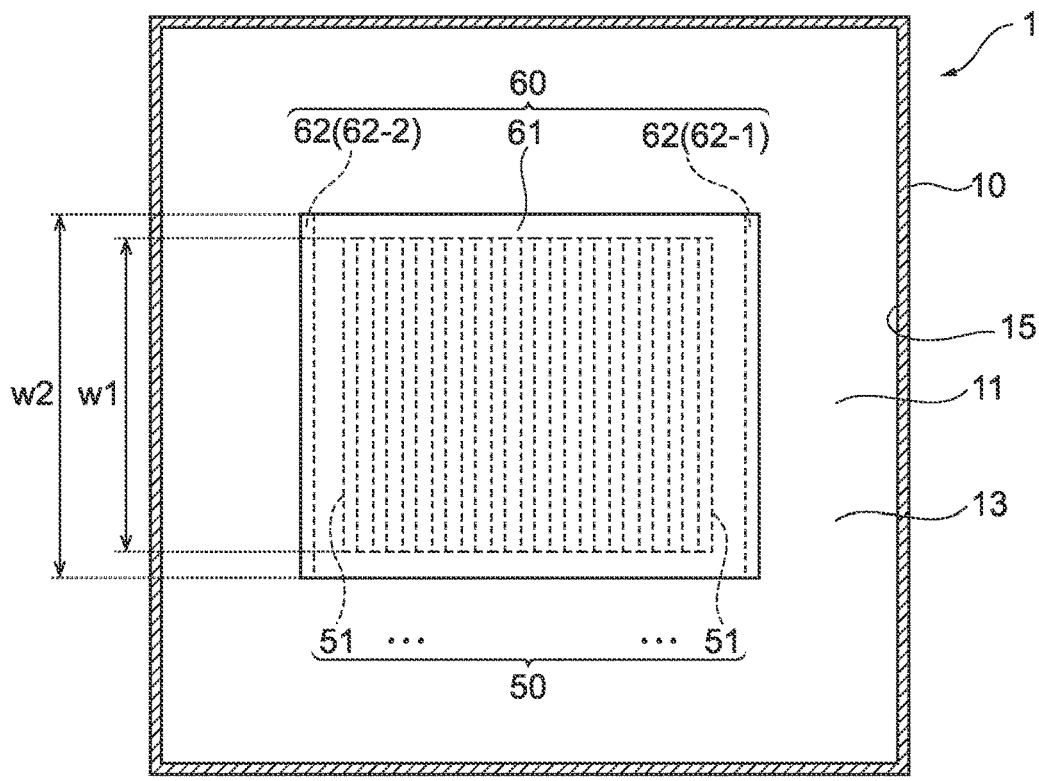
FIG. 3 is a sectional view taken along line A-A in FIG. 2, explaining the outline of the cooling device according to the first embodiment of the present disclosure.

Hereinafter, cooling devices according to embodiments of the present disclosure will be described with use of the drawings. First, a cooling device according to a first embodiment of the present disclosure will be described. FIG. 1 is a perspective view explaining an outline of the cooling device according to the first embodiment of the present disclosure. FIG. 2 is a sectional side view explaining the outline of the cooling device according to the first embodiment of the present disclosure. FIG. 3 is a sectional view taken along line A-A in FIG. 2, explaining the outline of the cooling device according to the first embodiment of the present disclosure.

As illustrated in FIGS. 1 to 3, a cooling device 1 according to the first embodiment of the present disclosure includes a container 10, a primary refrigerant 20 that is sealed in the inside of the container 10, and a condensation tube 40 through which a secondary refrigerant 30 flows, and which penetrates through a gaseous phase portion 11 in the inside of the container 10. A heating element 100 that is an object to be cooled is thermally connected to an outer surface 12 of the container 10, and thereby the heating element 100 is cooled. In the cooling device 1, the heating element 100 is thermally connected to a bottom surface 16 of the container 10.

A hollow cavity portion 13 is formed in the inside of the container 10. The cavity portion 13 is a space sealed to an external environment, and is depressurized by degassing. The container 10 is a planar type in which a dimension in a height direction is reduced, the rectangular parallelepiped container 10 is placed horizontally so that a plane direction of the container 10 is almost orthogonal to a direction of gravity, and the heating element 100 is thermally connected to the bottom surface 16 of the container 10 in a posture in which the heating element 100 is horizontally placed. The cooling device 1 is particularly effective when it is necessary to install a cooling device in a space which is narrow in a height direction. While the heating element 100 is mounted at a high density, it is possible to install the cooling device 1 even in a narrow and small space in this way.

Further, as illustrated in FIGS. 1 and 2, in the cavity portion 13, a predetermined amount of the primary refrigerant 20 in a liquid phase is stored. The primary refrigerant 20 in the liquid phase is stored in such a volume that the gaseous phase portion 11 can be formed in the inside of the container 10. The primary refrigerant 20 in a liquid phase exists at a lower side in the direction of gravity, of the cavity portion 13, and the gaseous phase portion 11 in which the primary refrigerant 20 in a liquid phase is not stored is formed at an upper side in the direction of gravity, of the cavity portion 13. In the cooling device 1, the heating element 100 is thermally connected to a part in which the primary refrigerant 20 in a liquid phase exists, on the outer surface 12 of the container 10. By adopting the above described part as the connection position of the heating element 100 to the container 10, heat transfer from the heating element 100 to the primary refrigerant 20 in a liquid phase is smoothly performed, and thermal resistance to the primary refrigerant 20 from the heating element 100 can be reduced.

In a region (bottom surface 16 in the cooling device 1) corresponding to the part to which the heating element 100 is thermally connected, of an inner surface 15 of the container 10, a container inner surface area increasing portion 50 that is a part that increases a surface area of the inner surface 15 of the container 10, such as protrusions and recesses, is formed. The container inner surface area increasing portion 50 is provided at a position overlapping the heating element 100 in plan view. Since the container inner surface area increasing portion 50 is formed, a contact area of the inner surface 15 of the container 10 and the primary refrigerant 20 in a liquid phase increases, in the region corresponding to the part to which the heating element 100 is thermally connected, on the inner surface 15 of the container 10. Accordingly, by the container inner surface area increasing portion 50, heat transfer to the primary refrigerant 20 in a liquid phase from the heating element 100 via the container 10 is performed smoothly. As a result, phase change to a gaseous phase from a liquid phase of the primary refrigerant 20 is promoted, and cooling characteristics of the cooling device 1 are more improved.

The container inner surface area increasing portion 50 is immersed in the primary refrigerant 20 in a liquid phase stored in the container 10. Accordingly, the container inner surface area increasing portion 50 directly contacts the primary refrigerant 20 in a liquid phase. The entire container inner surface area increasing portion 50 may be immersed in the primary refrigerant 20 in a liquid phase, or a part of the container inner surface area increasing portion 50 may be immersed in the primary refrigerant 20 in the liquid phase. Note that in the cooling device 1, the entire container inner surface area increasing portion 50 is immersed in the primary refrigerant 20 in a liquid phase.

The container inner surface area increasing portion 50 can be provided by molding of the container 10 by using a molding die, or by mounting a separate member from the container 10 to the inner surface 15 of the container 10, for example. As a mode of the container inner surface area increasing portion 50, protruded and recessed portions formed on the inner surface 15 of the container 10 can be cited, for example, and as specific examples, plate-shaped fins and pin fins provided to be upright on the inner surface 15 of the container 10, dented portions, groove portions and the like that are formed on the inner surface 15 of the container 10 can be cited. As a forming method of the plate-shaped fins and pin fins, for example, methods of attaching plate-shaped fins, or pin fins that are additionally produced to the inner surface 15 of the container 10 by soldering, brazing, sintering or the like, a method of cutting the inner surface 15 of the container 10, an extruding method, an etching method and the like are cited. Further, as a forming method of the dented portions, and the groove portions, for example, a method of cutting the inner surface 15 of the container 10, an extruding method, an etching method and the like are cited. Among them, the container inner surface area increasing portion 50 including a plurality of plate-shaped fins 51, 51 . . . is preferable from a viewpoint that heat transfer from the heating element 100 to the primary refrigerant 20 in a liquid phase is more excellent. From the above, in the cooling device 1, a plurality of square or rectangular plate-shaped fines 51 are disposed in parallel as the container inner surface area increasing portion 50.

A material of the container inner surface area increasing portion 50 is not specially limited, and, for example, a thermal conductive member can be cited. As specific examples of the material of the container inner surface area increasing portion 50, a metal member (for example, copper, a copper alloy, aluminum, an aluminum alloy, stainless steel and the like), and a carbon member (for example, graphite and the like) can be cited. Further, at least a part of the container inner surface area increasing portion 50 may be formed of a sintered body of a thermal conductive material, or an aggregate of a particulate thermal conductive material (not illustrated), and may be formed of, for example, a metal sintered body or an aggregate of carbon particles. The metal sintered body and the aggregate of carbon particles may be provided on a surface portion of the container inner surface area increasing portion 50, for example. More specifically, for example, a sintered body of a thermal conductive material such as a metal sintered body, or an aggregate of a particulate thermal conductive material such as an aggregate of carbon particles and/or metal powder may be formed in layers on surface portions of the plate-shaped fins 51 provided to be upright on the inner surface 15 of the container 10. A porous portion is formed in the container inner surface area increasing portion 50 because at least a part of the container inner surface area increasing portion 50 is formed of a sintered body of a thermal conductive material, or an aggregate of a particulate thermal conductive material, so that phase change of the primary refrigerant 20 from a liquid phase to a gaseous phase is further promoted, and the cooling performance of the cooling device 1 is further improved.

When the container inner surface area increasing portion 50 is formed of a sintered body of a thermal conductive material, or an aggregate of a particulate thermal conductive material, the entire container inner surface area increasing portion 50 becomes a porous body, and the primary refrigerant in a gaseous phase is generated and stays in the porous body, so that thermal conductivity from the container inner surface area increasing portion 50 to the primary refrigerant 20 in a liquid phase may not sufficiently be obtained. However, since the sintered bodies of the thermal conductive material, or the aggregates of the particulate thermal conductive material are formed in layers on the surface portions of the plate-shaped fins 51, the thermal conductivity from the container inner surface area increasing portion 50 to the primary refrigerant 20 in a liquid phase is improved while phase change from the liquid phase to the gaseous phase of the primary refrigerant 20 is further promoted, and as a result, the cooling performance of the cooling device 1 is further improved. As the material of the metal sintered body, for example, metal powder, metal fiber, metal mesh, metal braid, metal foil and the like can be cited. These metal materials may be used individually, or in combination of two or more. Further, a kind of metal of the metal sintered body is not specially limited, and, for example, copper, a copper alloy and the like can be cited. The metal sintered body can be formed by heating a metal material by heating means such as a furnace. Further, by thermally spraying metal powder to a surface of the plate-shaped fin 51, an aggregate of a particulate thermal conductive material that is in a coating film form having fine protrusions and recesses can be formed. Further, an aggregate of a particulate thermal conductive material may be formed by melting and forming metal powder by laser or the like. Further, carbon particles forming the aggregate of carbon particles is not specially limited, and, for example, carbon nano particles, carbon black and the like can be cited.

The condensation tube 40 is provided at an upper side in the direction of gravity, of the cavity portion 13 of the container 10. The condensation tube 40 is a tubular member, and penetrates through the gaseous phase portion 11 in the inside of the container 10. The condensation tube 40 is located above the inner surface 15 of the container 10 in the direction of gravity in the part to which the heating element 100 is thermally connected. An inner space of the condensation tube 40 does not communicate with the inside (the cavity portion 13) of the container 10. In other words, the inner space of the condensation tube 40 is a space that does not communicate with the gaseous phase portion 11, and is independent from the gaseous phase portion 11. Further, the condensation tube 40 does not contact the primary refrigerant 20 in a liquid phase that is stored and accumulated at the lower side in the direction of gravity. In other words, the primary refrigerant 20 in a liquid phase that is accumulated in the container 10 does not contact the condensation tube 40 through which the secondary refrigerant 30 flows. On an outer surface 41 of the condensation tube 40, a part (condensation tube outer surface area increasing portion) that increases a surface area of the outer surface 41 of the condensation tube 40 such as recesses and protrusions may be formed, or the outer surface 41 may be a smooth surface. Further, on an inner surface 42 of the condensation tube 40, a part (condensation tube inner surface area increasing portion) that increases a surface area of the inner surface 42 of the condensation tube 40 such as recesses and protrusions may be formed, or the inner surface 42 may be a smooth surface. In FIGS. 1 and 2, for convenience, both the outer surface 41 of the condensation tube 40 and the inner surface 42 of the condensation tube 40 are smooth surfaces.

As illustrated in FIGS. 1 and 2, in the cooling device 1, a plurality of condensation tubes 40, 40 . . . are provided. The plurality of condensation tubes 40, 40 . . . are disposed in parallel with one another in substantially a same plane, in the cavity portion 13. A sectional shape in a radial direction of the condensation tube 40 is not specially limited, and may be a circular shape, an elliptical shape, a flat shape, a quadrangular shape, a rounded rectangle or the like, and in the cooling device 1, the sectional shape in the radial direction of the condensation tube 40 is substantially circular.

Of the container 10, in a part corresponding to the gaseous phase portion 11, a through-hole (not illustrated) is formed, and the condensation tube 40 is inserted through the through-hole, and thereby the condensation tube 40 is mounted to the container 10 while keeping a sealed state of the cavity portion 13.

In the condensation tube 40, the secondary refrigerant 30 in a liquid phase flows in a fixed direction along an extending direction of the condensation tube 40. Accordingly, the secondary refrigerant 30 flows to penetrate through the gaseous phase portion 11 via a wall surface of the condensation tube 40. The secondary refrigerant 30 is cooled to a liquid temperature which is lower than an allowable maximum temperature of the heating element 100, for example.

As illustrated in FIGS. 1 to 3, in the cooling device 1, a plate-shaped member 60 having a shielding portion 61 is provided. The shielding portion 61 of the plate-shaped member 60 is located above the container inner surface area increasing portion 50 in the direction of gravity and below the condensation tube 40 in the direction of gravity. Further, at least a part of the shielding portion 61 is not immersed in the primary refrigerant 20 in a liquid phase that is accumulated at a lower side in the direction of the gravity in the cavity portion 13. In the cooling device 1, the entire shielding portion 61 is not immersed in the primary refrigerant 20 in a liquid phase that is accumulated at the lower side in the direction of gravity of the cavity portion 13. Accordingly, the entire shielding portion 61 is located in the gaseous phase portion 11 in the container 10. The shielding portion 61 is a plate-shaped part that extends along the bottom surface 16 of the container 10 and the container inner surface area increasing portion 50, and is interposed between the container inner surface area increasing portion 50 and the condensation tube 40. Further, the shielding portion 61 is sized to overlap the entire container inner surface area increasing portion 50 in plan view. From the above, the shielding portion 61 is provided at a position where the shielding portion 61 shields the entire container inner surface area increasing portion 50 from the condensation tube 40. Further, the shielding portion 61 is provided at the position where the shielding portion 61 overlaps the heating element 100 in plan view.

In the cooling device 1, the shielding portion 61 is a member in the flat plate shape. Further, in the cooling device 1, a shape in plan view of the shielding portion 61 corresponds to a shape in plan view of the container inner surface area increasing portion 50, and since the shape in plan view of the container inner surface area increasing portion 50 is rectangular, the shape in plan view of the shielding portion 61 is rectangular. Further, the shielding portion 61 is not in contact with the inner surface 15 of the container 10, and spaces are formed between side surfaces of the shielding portion 61 and the inner surface 15 of the container 10.

Further, as illustrated in FIGS. 1 and 2, the plate-shaped member 60 includes support portions 62 that extend from the shielding portion 61. In other words, the plate-shaped member 60 has the shielding portion 61 and the support portions 62. The support portion 62 extends along the direction of gravity. Further, the support portion 62 is provided in a part of a periphery along an orthogonal direction to the direction of gravity, of the container inner surface area increasing portion 50. Accordingly, the support portion 62 is provided outside of the container inner surface area increasing portion 50. One end 63 of the support portion 62 continues to the shielding portion 61, and another end 64 of the support portion 62 is in contact with the bottom surface 16 of the container 10. By the support portions 62, the shielding portion 61 is fixed to a predetermined position. The support portion 62 is not in contact with the inner surface 15 of the container 10 except for the bottom surface 16.

In the cooling device 1, the support portion 62 is a rectangular flat plate part. Further, the cooling device 1 has two support portions 62-1 and 62-2 that face each other. The plate-shaped member 60 is in a shape in which the support portions 62-1 and 62-2 extend in a vertical direction from both end portions of the shielding portion 61. Accordingly, in a periphery of the container inner surface area increasing portion 50 in which the shape in plan view is rectangular, two facing sides are closed by the support portion 62-1 and the support portion 62-2 of the plate-shaped member 60, and two other facing sides are opened. From the above, the container inner surface area increasing portion 50 communicates with an outside of the plate-shaped member 60 in positions of the two other facing sides. Further, the plate-shaped member 60 has closed portions formed of the support portions 62 and opened portions that are not provided with the support portions 62. Further, as illustrated in FIG. 3, in the cooling device 1, widths of the support portions 62-1 and 62-2 are substantially the same as a width of the shielding portion 61. Accordingly, it is possible to form the plate-shaped member 60 by bending a rectangular flat plate between the shielding portion 61, and the support portions 62-1 and 62-2.

The support portion 62 has the other end 64 joined to the bottom surface 16 of the container 10, whereby the plate-shaped member 60 is fixed to the inner surface 15 of the container 10, and the shielding portion 61 is fixed to a predetermined position. Accordingly, fixed stability of the plate-shaped member 60 to the container 10 is improved. Further, the support portion 62 is integrated with the inner surface 15 of the container 10 by the other end 64 being joined to the bottom surface 16 of the container 10. A method for the above described joining is not specially limited, but welding, brazing and the like are cited, for example.

It is possible to prevent droplets of the primary refrigerant 20 from adhering to the condensation tube 40 even when the primary refrigerant 20 is boiled by heat from the heating element 100, even when the cooling device 1 is compactified (compactified in a height direction), by the plate-shaped member 60 having the shielding portion 61 that is not immersed in the primary refrigerant 20 in a liquid phase being provided above the container inner surface area increasing portion 50 in the direction of gravity and below the condensation tube in the direction of gravity. Accordingly, even when the cooling device 1 is compactified, it is possible to prevent decline of the condensation efficiency of the primary refrigerant 20 by the condensation tube 40, and excellent cooling performance is obtained.

Further, since the primary refrigerant 20 that changes in phase from a gaseous phase to a liquid phase by a cooling action of the condensation tube 40 drops to the shielding portion 61 of the plate-shaped member 60 from the outer surface 41 of the condensation tube 40 and the shielding portion 61 is cooled, the shielding portion 61 can contribute to condensation of the primary refrigerant in a gaseous phase, and the primary refrigerant 20 in a liquid phase can smoothly flows back to the container inner surface area increasing portion 50. Further, the shielding portion 61 of the plate-shaped member 60 restrains the droplets of the primary refrigerant 20 from spreading to the gaseous phase portion 11 of the container 10, and thereby it is possible to prevent the primary refrigerant 20 that receives heat from the heating element 100 from becoming insufficient. Accordingly, even when the heat generation amount of the heating element 100 increases, it is possible to prevent the primary refrigerant 20 in a liquid phase from drying out, and excellent cooling performance is obtained.

Further, the shielding portion 61 of the plate-shaped member 60 can contribute to condensation of the primary refrigerant in a gaseous phase, and therefore, even when the heat generation amount of the heating element 100 increases, it is possible to operate the cooling device 1 smoothly without augmenting the condensation tube 40. Further, the plate-shaped member 60 includes the support portions 62 in part of the periphery of the container inner surface area increasing portion 50, whereby even when the primary refrigerant 20 in a liquid phase that is accumulated in the inside of the container 10 boils and a liquid surface of the primary refrigerant 20 swells, the primary refrigerant 20 is quickly returned to the position of the container inner surface area increasing portion 50, and therefore it is possible to immerse the container inner surface area increasing portion 50 in the primary refrigerant 20 in a liquid phase reliably.

A ratio (L/H) of a distance L from a tip end of the plate-shaped fin 51 to a surface at a lower side in the direction of gravity of the shielding portion 61 to a height H of the plate-shaped fin 51, illustrated in FIG. 2, is not specially limited, but is preferably 0 or more and 4.0 or less, and particularly preferably 1.0 or more and 2.0 or less, for example, from a viewpoint that the primary refrigerant that receives the heat of the heating element 100 and changes in phase from a liquid phase to a gaseous phase can smoothly flow to the condensation tube 40 while the droplets of the boiled primary refrigerant 20 is reliably prevented from adhering to the condensation tube 40. Note that in FIG. 2, for convenience of explanation on the drawing, L/H is less than 1.0.

A ratio (W2/W1) of a width W2 of the shieling portion 61 to a width W1 of the plate-shaped fin, illustrated in FIG. 3, is not specially limited, but is preferably 0.3 or more and 1.5 or less, and particularly preferably 0.5 or more and 1.2 or less, from a viewpoint that the primary refrigerant that receives the heat of the heating element 100 and changes in phase from a liquid phase to a gaseous phase can smoothly flow to the condensation tube 40 while the droplets of the boiled primary refrigerant 20 is reliably prevented from adhering to the condensation tube 40. Note that in FIG. 3, the above described ratio (W2/W1) is more than 1.0.

A material of the container 10 is not specially limited, but a wide range of materials can be used, and, for example, copper, a copper alloy, aluminum, an aluminum alloy, nickel, a nickel alloy, stainless steel, titanium, a titanium alloy and the like can be cited. A material of the condensation tube 40 is not specially limited, and, for example, copper, a copper alloy, aluminum, an aluminum alloy, nickel, a nickel alloy, stainless steel, titanium, a titanium alloy and the like can be cited. The primary refrigerant is not specially limited, but a wide range of materials can be used, and, for example, an electrically insulating refrigerant can be cited. As specific examples, for example, water, fluorocarbons, cyclopentane, ethylene glycol, a mixture of these substances and the like can be cited. Among the primary refrigerants, from a viewpoint of electrical insulation, fluorocarbons, cyclopentane, and ethylene glycol are preferable, and fluorocarbons are specially preferable. The secondary refrigerant is not specially limited, and, for example, water, antifreeze (main component is, for example, ethylene glycol) and the like can be cited.

Next, an operation of the cooling device 1 according to the first embodiment and a cooling system using the cooling device 1 will be described. First, the operation of the cooling device 1 will be described.

The primary refrigerant 20 in a liquid phase accumulated in the lower side in the direction of gravity, of the cavity portion 13 receives heat from the heating element 100, and thereby the primary refrigerant 20 in the liquid phase changes in phase to a gaseous phase, and absorbs the heat from the heating element 100 as latent heat. The primary refrigerant that changes in phase to the gaseous phase moves above in the direction of gravity, and flows into the entire gaseous phase portion 11 of the container 10 via the opened portions of the plate-shaped member 60. On the other hand, in the condensation tube 40 penetrating through the gaseous phase portion 11, the secondary refrigerant 30 having a low temperature flows. Further, by the shielding portion 61 of the plate-shaped member 60, the droplets of the primary refrigerant 20 that boils and spreads are prevented from adhering to the outer surface 41 of the condensation tube 40. Since the low-temperature secondary refrigerant 30 flows through the condensation tube 40 to which the droplets of the primary refrigerant 20 is prevented from adhering, the condensation tube 40 disposed in the gaseous phase portion 11 exhibits an excellent heat exchanging action. The primary refrigerant which changes in phase to a gaseous phase contacts or approaches the outer surface 41 of the condensation tube 40, thereby releases the latent heat by the heat exchange action of the condensation tube 40, and changes in phase to a liquid phase from the gaseous phase. The latent heat released from the primary refrigerant at the time of phase change to the liquid phase from the gaseous phase is transferred to the secondary refrigerant 30 that flows through the condensation tube 40. Further, the primary refrigerant 20 which changes in phase to the liquid phase flows back to a lower side in the direction of gravity from the gaseous phase portion 11 as the primary refrigerant 20 in the liquid phase, by a gravity action. At this time, the shielding portion 61 of the plate-shaped member 60 is cooled by the primary refrigerant 20 of the liquid phase that flows back. The primary refrigerant 20 repeats phase change from a liquid phase to a gaseous phase and from the gaseous phase to a liquid phase in the inner space of the container 10. In the cooling device 1, the gaseous phase portion 11 of the container 10 has a predetermined volume, and therefore, it is not necessary to form a circulation path of the primary refrigerant 20 like a partition plate when the primary refrigerant 20 repeats phase change from a liquid phase to a gaseous phase and from the gaseous phase to a liquid phase in the inner space of the container 10. Accordingly, it is possible to simplify a structure of the container 10. The secondary refrigerant 30 that receives heat from the primary refrigerant flows from the inside to the outside of the cooling device 1 along the extending direction of the condensation tube 40, and thereby heat of the heating element 100 is transported to the outside of the cooling device 1.

Next, the cooling system using the cooling device 1 according to the first embodiment will be described. In the cooling system using the cooling device 1, the cooling device 1, and a secondary refrigerant cooling portion (not illustrated) to which the condensation tube 40 extending from the cooling device 1 is connected are used. Further, in the above described cooling system, a circulation path of the condensation tube 40 in which the condensation tube 40 circulates in a loop shape in the cooling device 1 and the secondary refrigerant cooling portion is formed. The secondary refrigerant 30 receiving heat from the primary refrigerant flows through the condensation tube 40 from the cooling device 1 to the secondary refrigerant cooling portion, and is cooled to a predetermined liquid temperature, for example, a liquid temperature lower than the allowable maximum temperature of the heating element 100, in the secondary refrigerant cooling portion. The secondary refrigerant 30 which is cooled in the secondary refrigerant cooling portion flows through the condensation tube 40, flows back to the cooling device 1 from the secondary refrigerant cooling portion, and exhibits a heat exchange action in the gaseous phase portion 11 of the cooling device 1. Accordingly, the secondary refrigerant 30 circulates in the loop shape in the cooling device 1 and the secondary refrigerant cooling portion, and thereby the secondary refrigerant 30 which is cooled is continuously supplied to a region of the gaseous phase portion 11.

Next, a cooling device according to a second embodiment of the present disclosure will be described. Note that the cooling device according to the second embodiment has common main components as the cooling device according to the first embodiment, and therefore the same components as the components of the cooling device according to the first embodiment will be described by using the same reference signs. Note that FIG. 4 is a sectional side view explaining an outline of the cooling device according to the second embodiment of the present disclosure.

Figure 4:
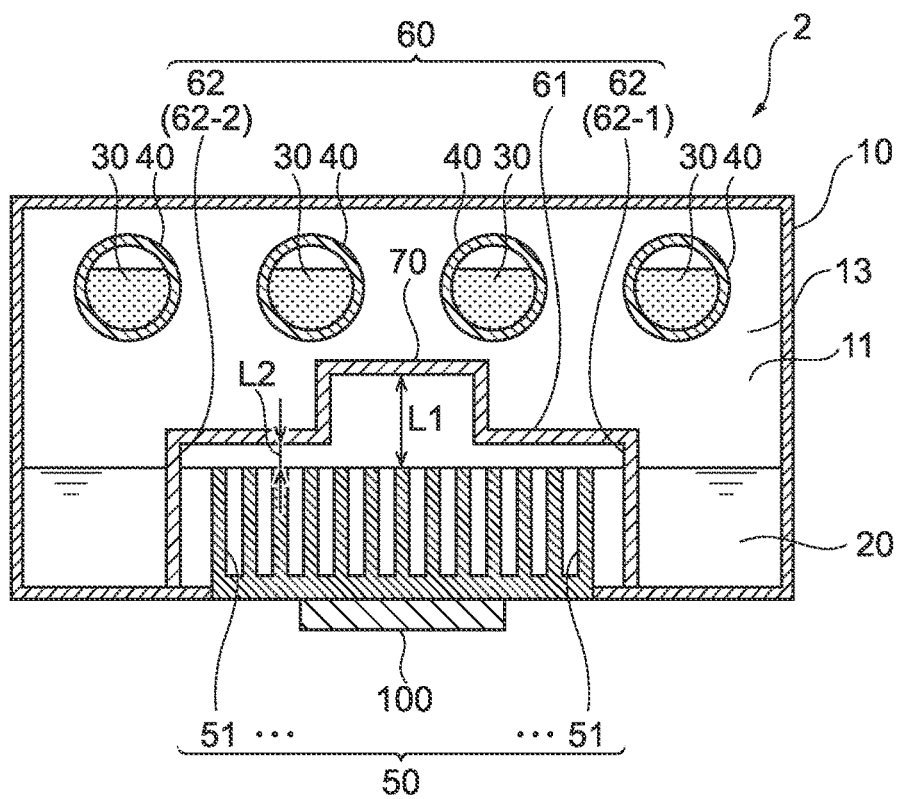
FIG. 4 is a sectional side view explaining an outline of a cooling device according to a second embodiment of the present disclosure.

In the cooling device 1 according to the first embodiment, the shielding portion 61 is the member in the flat plate shape, but as illustrated in FIG. 4, in a cooling device 2 according to the second embodiment, instead of this, a shielding portion 61 has a protruded portion 70 that protrudes above in a direction of gravity, in a substantially central portion in plan view. Further, the protruded portion 70 is formed across the shielding portion 61 along a plane direction of the shielding portion 61. A distance L1 from a tip end of a plate-shaped fin 51 to a surface at a lower side in the direction of gravity of the shielding portion 61 in the protruded portion 70 is larger than a distance L2 from the tip end of the plate-shaped fin 51 to the surface at the lower side in the direction of gravity of the shielding portion 61 in a periphery of the protruded portion 70. As a position of the protruded portion 70, it is possible to cite a position where a primary refrigerant is easily vaporized, for example. Specifically, as the position of the protruded portion 70, it is possible to cite a position that overlaps a heating element 100 that is thermally connected to a container 10, in plan view.

Since the shielding portion 61 has the protruded portion 70, the primary refrigerant in a gaseous phase can smoothly flow to a direction of a condensation tube 40 from the lower side in the direction of gravity, of the shielding portion 61.

Next, a cooling device according to a third embodiment of the present disclosure will be described. Note that the cooling device according to the third embodiment has common main components as the cooling devices according to the first and the second embodiments, and therefore the same components as the components of the cooling devices according to the first and the second embodiments will be described by using the same reference signs. Note that FIG. 5 is a sectional side view explaining an outline of the cooling device according to the third embodiment of the present disclosure.

Figure 5:
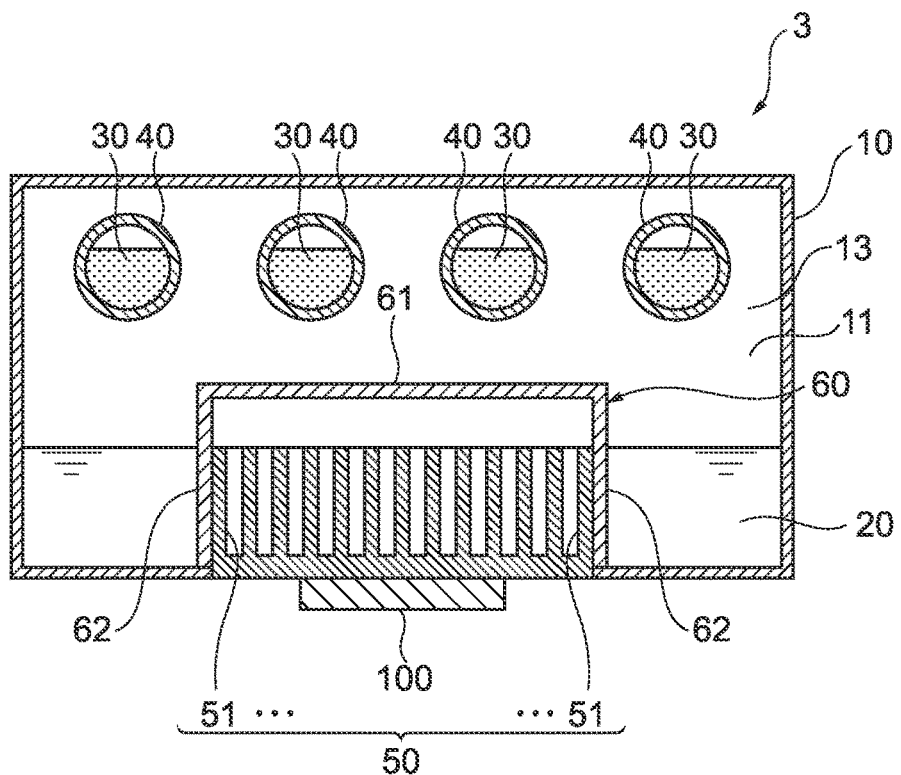
FIG. 5 is a sectional side view explaining an outline of a cooling device according to a third embodiment of the present disclosure.

In the cooling device 1 according to the first embodiment, the support portions 62 of the plate-shaped member 60 are integrated with the inner surface 15 of the container 10, but as illustrated in FIG. 5, in a cooling device 3 according to the third embodiment, instead of this, support portions 62 of a plate-shaped member 60 are integrated with a container inner surface area increasing portion 50. In the cooling device 3, the support portions 62 are joined to plate-shaped fins 51 that are located at an outermost portion of the container inner surface area increasing portion 50, and thereby the support portions 62 are integrated with the container inner surface area increasing portion 50. A method for the above described joining is not specially limited, but, for example, brazing, soldering and the like are cited.

Further, since in the cooling device 3, the support portions 62 of the plate-shaped member 60 are integrated with the container inner surface area increasing portion 50, heat from a heating element 100 is also transmitted to the support portions 62 of the plate-shaped member 60. Accordingly, a surface area increasing portion that increases a surface area of a surface of the support portion 62, such as a metal sintered body may be formed on the surface of the support portion 62 that is immersed in a primary refrigerant 20 in a liquid phase. By forming the surface area increasing portion on the surface of the support portion 62, phase change of the primary refrigerant 20 from a liquid phase to a gaseous phase is further promoted.

When the support portions 62 are integrated with the container inner surface area increasing portion 50, fixed stability of the plate-shaped member 60 to the container 10 is also improved.

Next, a cooling device according to a fourth embodiment of the present disclosure will be described. Note that the cooling device according to the fourth embodiment has common main components as the cooling devices according to the first to the third embodiments, and therefore the same components as the components of the cooling devices according to the first to the third embodiments will be described by using the same reference signs. Note that FIG. 6 is a sectional side view explaining an outline of the cooling device according to the fourth embodiment of the present disclosure.

Figure 6:
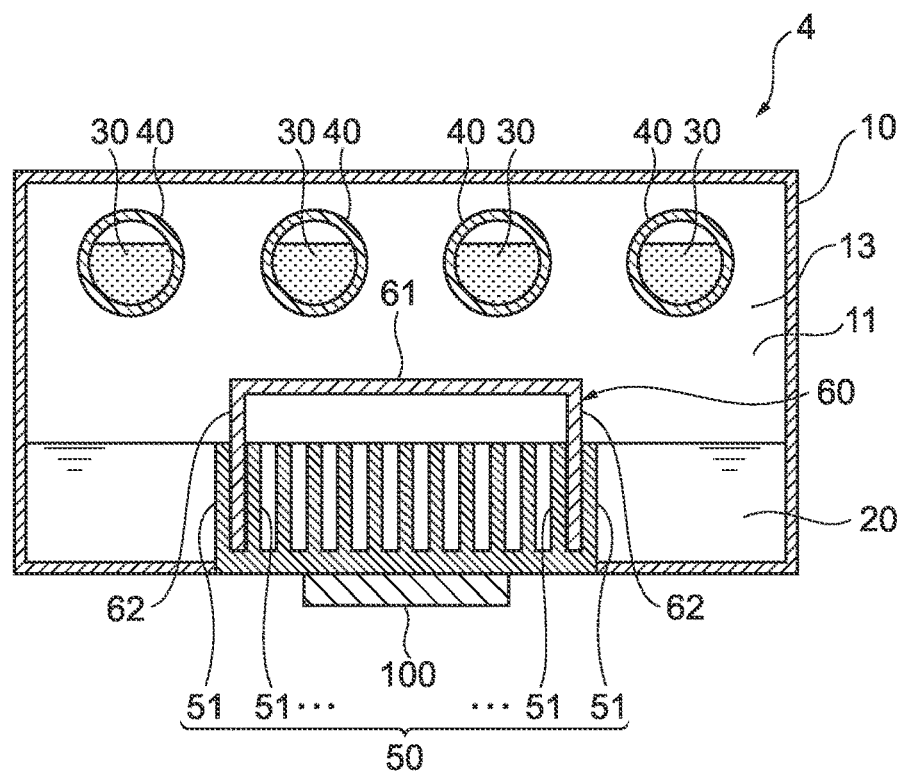
FIG. 6 is a sectional side view explaining an outline of a cooling device according to a fourth embodiment of the present disclosure.

In the cooling device 3 according to the third embodiment, the support portions 62 are joined to the plate-shaped fins 51, whereby the support portions 62 are integrated with the container inner surface area increasing portion 50, but as illustrated in FIG. 6, in a cooling device 4 according to the fourth embodiment, instead of this, support portions 62 of a plate-shaped member 60 are fixed to a container 10 by being sandwiched by plate-shaped fins 51. In the cooling device 4, the support portions 62 are each sandwiched by a plate-shaped fin 51 that is located at an outermost portion of a container inner surface area increasing portion 50 and a plate-shaped fin 51 adjacent to the plate-shaped fin 51 located at the outermost portion.

Since the support portions 62 are each sandwiched by the plate-shaped fins 51, it is possible to obtain fixed stability of the plate-shaped member 60 to the container 10 easily.

Next, a cooling device according to a fifth embodiment of the present disclosure will be described. Note that the cooling device according to the fifth embodiment has common main components as the cooling devices according to the first to the fourth embodiments, and therefore the same components as the components of the cooling devices according to the first to the fourth embodiments will be described by using the same reference signs. Note that FIG. 7 is a sectional side view explaining an outline of the cooling device according to the fifth embodiment of the present disclosure.

Figure 7:
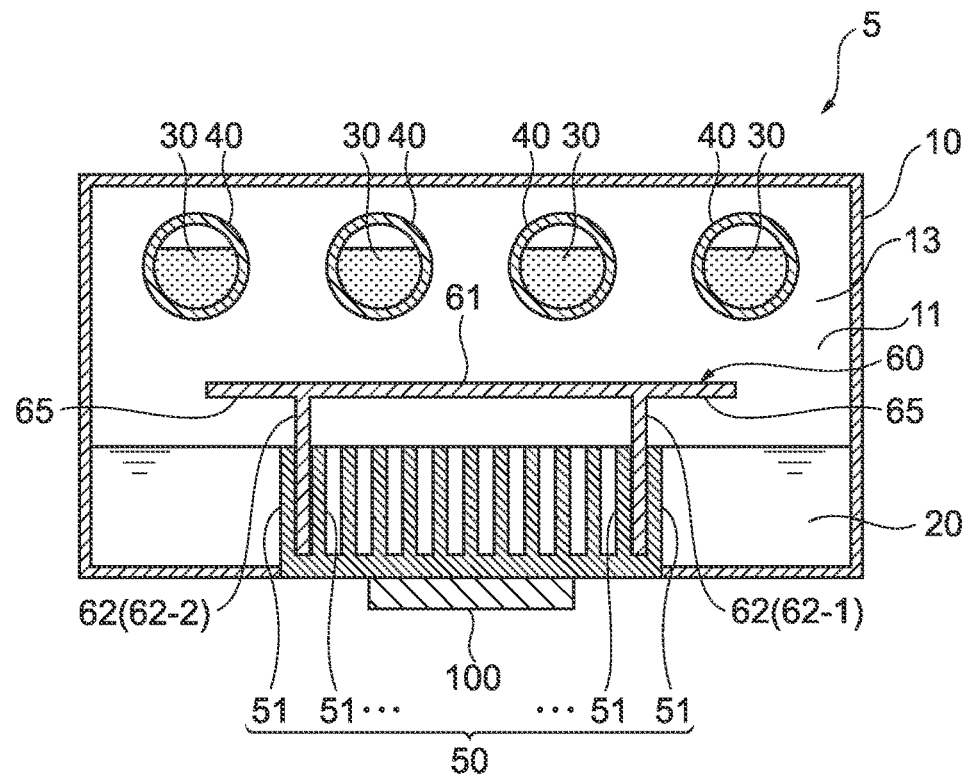
FIG. 7 is a sectional side view explaining an outline of a cooling device according to a fifth embodiment of the present disclosure.

In each of the cooling devices 1 to 4 according to the first to the fourth embodiments, in the plate-shaped member 60, the support portions 62-1 and 62-2 extend in the vertical direction from both the end portions of the shielding portion 61, but as illustrated in FIG. 7, in a cooling device 5 according to the fifth embodiment, instead of this, support portions 62-1 and 62-2 extend in a vertical direction from inward parts from end portions of a shielding portion 61. Further, the support portions 62 are each sandwiched by a plate-shaped fin 51 that is located at an outermost portion of a container inner surface area increasing portion 50 and a plate-shaped fin 51 adjacent to the plate-shaped fin 51 located at the outermost portion.

Accordingly, in the cooling device 5, an area in plan view of the shielding portion 61 is in a mode larger than areas in plan view of the shielding portions 61 of the cooling devices 1 to 4. The shielding portion 61 of the plate-shaped member 60 has shielding portion extension parts 65 that are extended toward a direction of an inner surface 15 of a container 10 from the support portions 62-1 and 62-2. The shielding portion extension part 65 is a part in a flat plate shape.

The shielding portion 61 has the shielding portion extension parts 65, and therefore even when a boiling region of a primary refrigerant 20 enlarges, it is possible to prevent droplets of the primary refrigerant 20 from adhering to condensation tubes reliably.

Next, a cooling device according to a sixth embodiment of the present disclosure will be described. Note that the cooling device according to the sixth embodiment has common main components as the cooling devices according to the first to the fifth embodiments, and therefore the same components as the components of the cooling devices according to the first to the fifth embodiments will be described by using the same reference signs. Note that FIG. 8 is a sectional plan view explaining an outline of the cooling device according to the sixth embodiment of the present disclosure.

Figure 8:
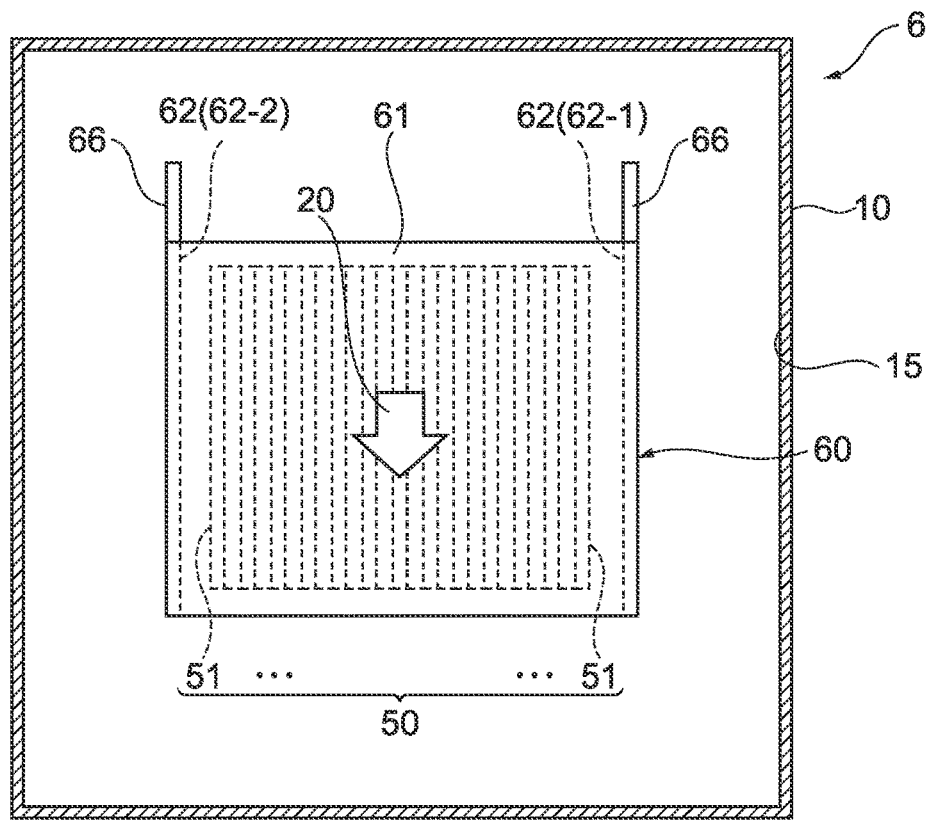
FIG. 8 is a sectional plan view explaining an outline of a cooling device according to a sixth embodiment of the present disclosure.

In each of the cooling devices 1 to 5 according to the first to the fifth embodiments, the widths of the support portions 62-1 and 62-2 are substantially the same as the width of the shielding portion 61, but as illustrated in FIG. 8, in a cooling device 6 according to the sixth embodiment, instead of this, widths of support portions 62-1 and 62-2 of a plate-shaped member 60 are wider than a width of a shielding portion 61. The support portions 62-1 and 62-2 each have a first extension part 66 extending in a direction of an inner surface 15 of a container 10 from the shielding portion 61. The first extension part 66 is a part in a flat plate shape. Since the shielding portion 61 is not provided on an upper side in the direction of gravity, of the first extension parts 66, the upper side in the direction of gravity, of the first extension parts 66 is opened.

Since the support portions 62-1 and 62-2 have the first extension parts 66, a primary refrigerant 20 in a liquid phase is regulated by the first extension parts 66, and can smoothly flow to a container inner surface area increasing portion 50.

Next, a cooling device according to a seventh embodiment of the present disclosure will be described. Note that the cooling device according to the seventh embodiment has common main components as the cooling devices according to the first to the sixth embodiments, and therefore the same components as the components of the cooling devices according to the first to the sixth embodiments will be described by using the same reference signs. Note that FIG. 9 is a sectional side view explaining an outline of the cooling device according to the seventh embodiment of the present disclosure.

Figure 9:
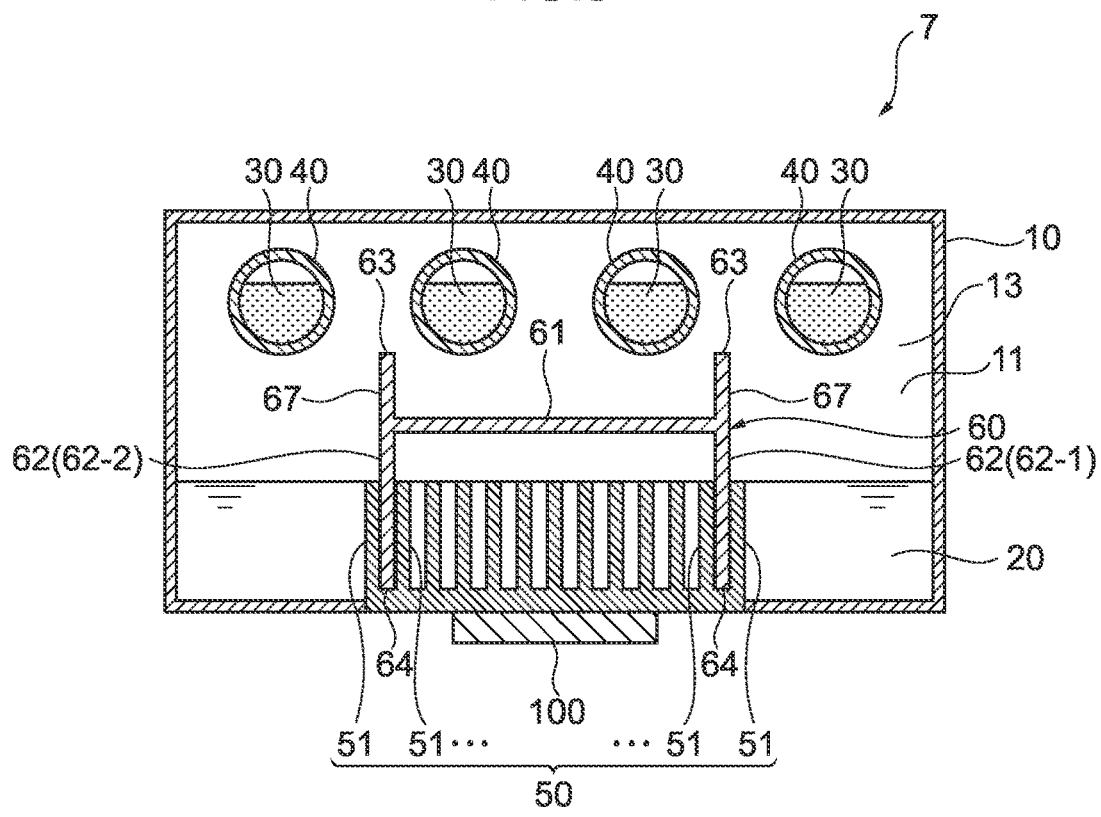
FIG. 9 is a sectional side view explaining an outline of a cooling device according to a seventh embodiment of the present disclosure.

As illustrated in FIG. 9, in a cooling device 7 according to the seventh embodiment, support portions 62-1 and 62-2 of a plate-shaped member 60 further have second extension parts 67 extending above in a direction of gravity from a shielding portion 61. The second extension part 67 is a part in a flat plate shape. For example, it is possible to form the second extension part 67 by providing the shielding portion 61 between one end 63 and another end 64 of a support portion 62, for example.

Since the support portions 62-1 and 62-2 have the second extension parts 67, a primary refrigerant 20 in a liquid phase that is condensed on an outer surface 41 of a condensation tube 40 flows back to a container inner surface area increasing portion 50 more reliably by flowing back along the second extension parts 67.

Next, a cooling device according to an eighth embodiment of the present disclosure will be described. Note that the cooling device according to the eighth embodiment has common main components as the cooling devices according to the first to the seventh embodiments, and therefore the same components as the components of the cooling devices according to the first to the seventh embodiments will be described by using the same reference signs. Note that FIG. 10 is a sectional side view explaining an outline of the cooling device according to the eighth embodiment of the present disclosure.

Figure 10:
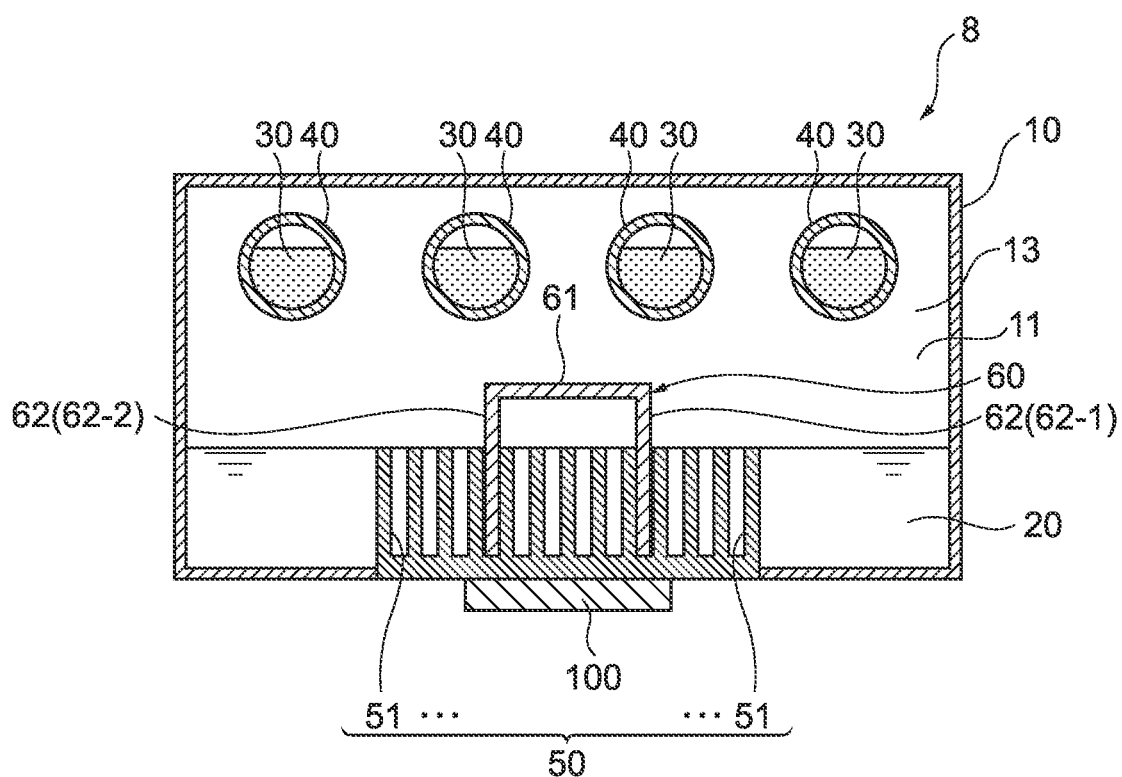
FIG. 10 is a sectional side view explaining an outline of a cooling device according to an eighth embodiment of the present disclosure.

As illustrated in FIG. 10, in a cooling device 8 according to the eighth embodiment, a shielding portion 61 of a plate-shaped member 60 is provided on only a part directly above a heating element 100. In other words, the shielding portion 61 is provided at only a portion that overlaps the heating element 100 in plan view. Further, support portions 62-1 and 62-2 are each sandwiched by plate-shaped fins 51.

In the cooling device 8, an area in plan view of the shielding portion 61 is reduced, and therefore a primary refrigerant in a gaseous phase can more smoothly flow in a direction of a condensation tube 40 from a lower side in a direction of gravity of the shielding portion 61.

Next, a cooling device according to a ninth embodiment of the present disclosure will be described. Note that the cooling device according to the ninth embodiment has common main components as the cooling devices according to the first to the eighth embodiments, and therefore the same components as the components of the cooling devices according to the first to the eighth embodiments will be described by using the same reference signs. Note that FIG. 11 is a sectional side view explaining an outline of the cooling device according to the ninth embodiment of the present disclosure.

Figure 11:
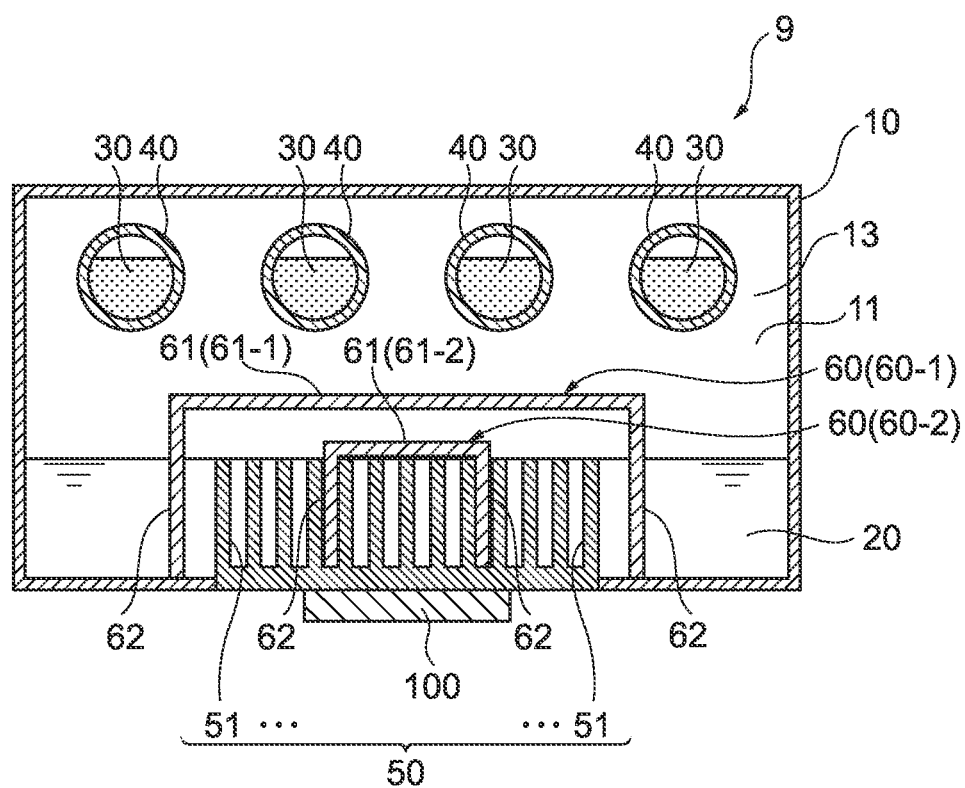
FIG. 11 is a sectional side view explaining an outline of a cooling device according to a ninth embodiment of the present disclosure.

As illustrated in FIG. 11, in a cooling device 9 according to the ninth embodiment, a plurality of shielding portions 61 are provided along a direction of gravity. In the cooling device 9, two shielding portions 61-1 and 61-2 are provided along the direction of gravity. A plate-shaped member 60-1 in which support portions 62 are provided at an outside of a container inner surface area increasing portion 50 has the shielding portion 61-1 at an upper side in the direction of gravity, and a plate-shaped member 60-2 in which support portions 62 are each sandwiched by plate-shaped fins 51 of the container inner surface area increasing portion 50 has the shielding portion 61-2 at a lower side in the direction of gravity. Further, the support portions 62 of the plate-shaped member 60-1 are disposed to face the support portions 62 of the plate-shaped member 60-2. In other words, a plate-shaped member 60 of a multistage structure (two-stage structure in FIG. 11) is formed, in which the plate-shaped member 60-2 is disposed inside of the plate-shaped member 60-1.

In the cooling device 9, the plate-shaped member 60 has the multistage structure, and therefore, a primary refrigerant 20 in a liquid phase can more smoothly flow back to the container inner surface area increasing portion 50.

Next, a cooling device according to a tenth embodiment of the present disclosure will be described. Note that the cooling device according to the tenth embodiment has common main components as the cooling devices according to the first to the ninth embodiments, and therefore the same components as the components of the cooling devices according to the first to the ninth embodiments will be described by using the same reference signs. Note that FIG. 12 is a perspective view explaining an outline of the cooling device according to the tenth embodiment of the present disclosure, and FIG. 13 is a sectional side view explaining the outline of the cooling device according to the tenth embodiment of the present disclosure.

Figure 12:
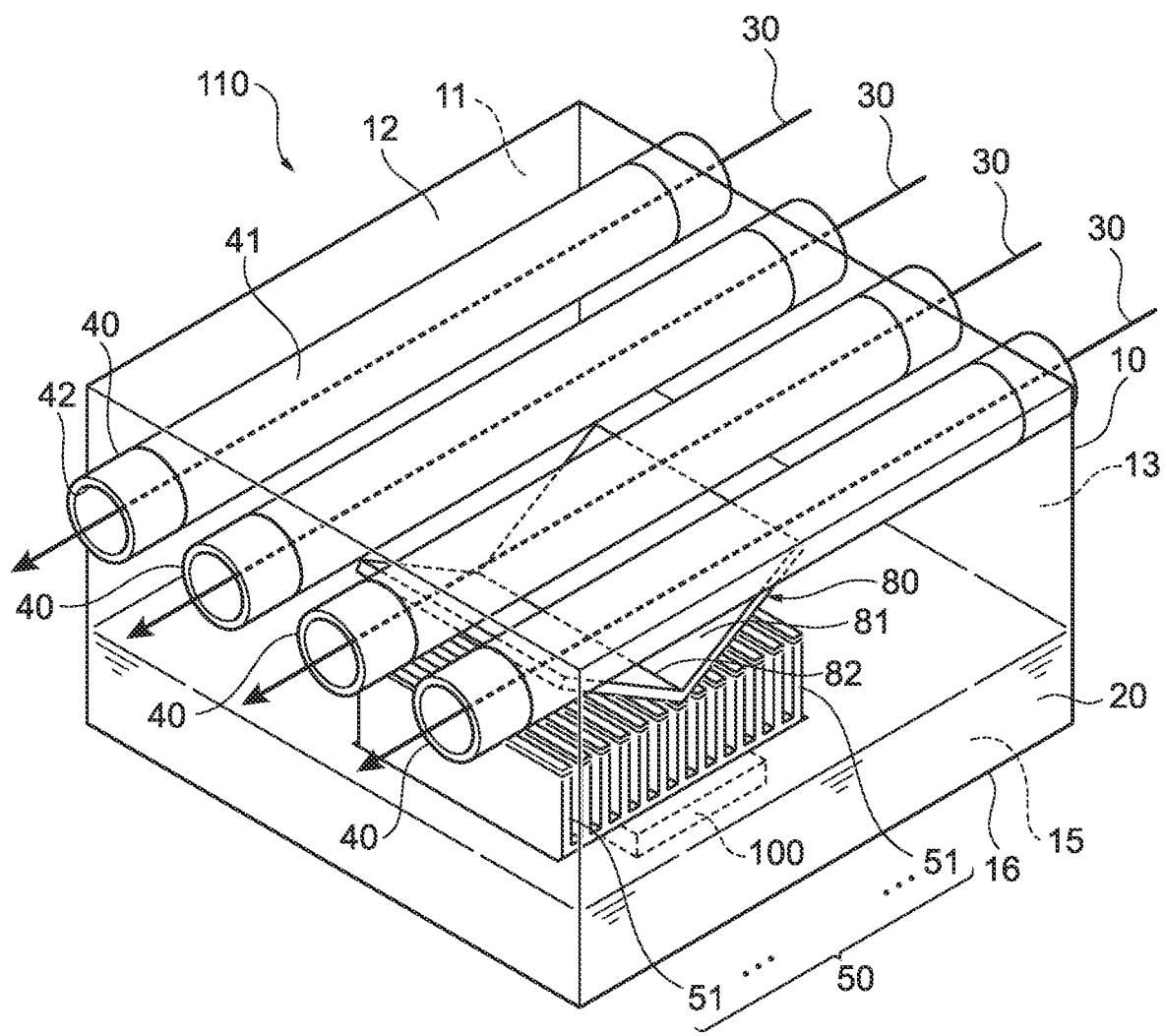
FIG. 12 is a perspective view explaining an outline of a cooling device according to a tenth embodiment of the present disclosure.
Figure 13:
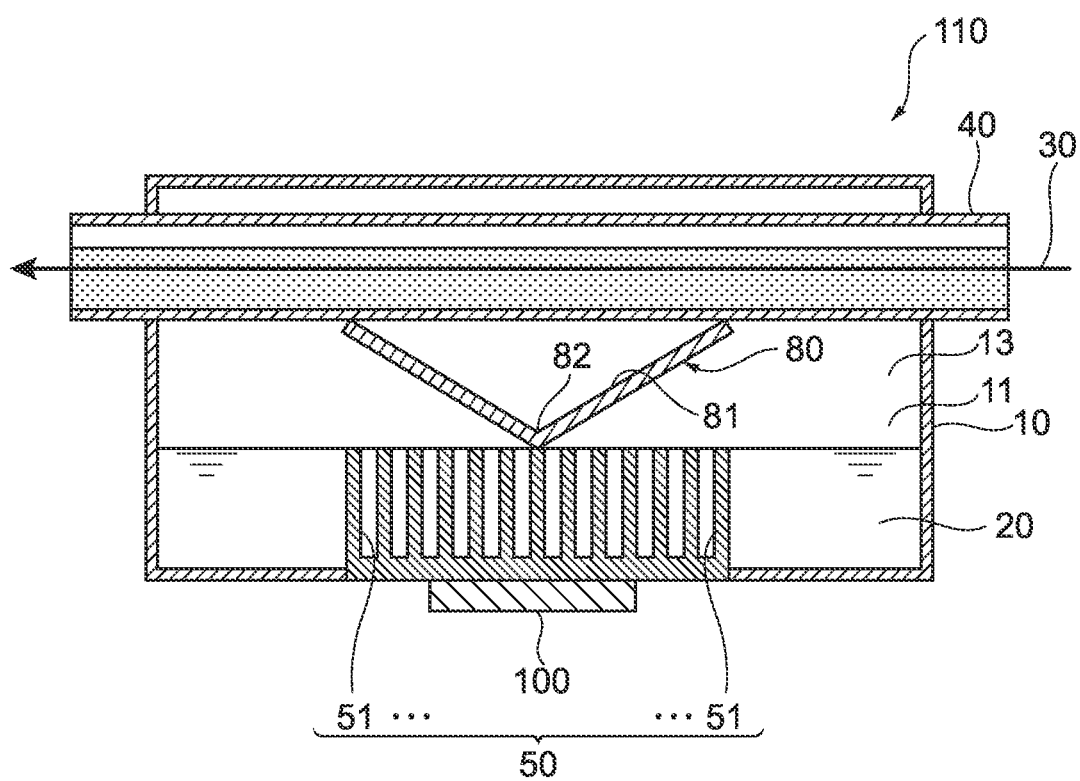
FIG. 13 is a sectional side view explaining the outline of the cooling device according to the tenth embodiment of the present disclosure.

In each of the cooling devices 1 to 9 according to the above described first to ninth embodiments, the plate-shaped member 60 is in a form in which the two support portions 62 extend in the vertical direction from the shielding portion 61, but as illustrated in FIGS. 12 and 13, in a plate-shaped member 80 of a cooling device 110 according to the tenth embodiment, instead of this, a shielding portion 81 has a bent portion 82 that is bent in a direction of gravity, and support portions are not provided. The bent portion 82 is provided in a center portion in a width direction of the shielding portion 81. The plate-shaped member 80 is a member that is V-shaped in side view.

The bent portion 82 is in contact with a container inner surface area increasing portion 50, and edge portions 83 of the shielding portion 81 are in contact with condensation tubes 40, whereby the plate-shaped member 80 is fixed. In other words, the plate-shaped member 80 is fixed by being fitted in between the container inner surface area increasing portion 50 and the condensation tubes 40. Accordingly, in the cooling device 110, it is possible to obtain fixed stability of the shielding portion 81 of the plate-shaped member 80 easily. Further, in the cooling device 110, it is possible to separate a flow of a primary refrigerant that changes in phase from a gaseous phase to a liquid phase and flows from an upper side to a lower side in the direction of gravity, and a flow of the primary refrigerant that changes in phase from a liquid phase to a gaseous phase and flows from the lower side to the upper side in the direction of gravity more reliably. Accordingly, in the cooling device 110, it is possible to obtain excellent cooling performance.

Next, cooling devices according to other embodiments of the present disclosure will be described. In the cooling device of each of the above described embodiments, the plate-shaped shielding portion is used, and a through port may be provided in the shielding portion as necessary. A number of through ports may be one, or may be two or more. Further, a mesh member may be put on the through port. It is possible to smoothen a flow of a primary refrigerant that changes in phase from a liquid phase to a gaseous phase to a direction of a condensation tube more by providing the through hole in the shielding portion. Further, in the cooling device of each of the embodiments described above, the shape in plan view of the container is a quadrangular shape, but the shape of the container is not specially limited, and, for example, may be a polygon of a pentagon or more, a circle, an ellipse or a combination of these shapes. Further, in the cooling device of each of the embodiments described above, the single heating element is thermally connected to the container, but a number of heating elements which are thermally connected to the container is not specially limited, and may be two or more.

Since the cooling device of the present disclosure can exhibit excellent cooling characteristics while avoiding increase in size of the device, the cooling device of the present disclosure is usable in an extensive field, and is highly useful in a field of cooling electronic components having a large amount of heat generation mounted on circuit boards, such as a central processing unit (CPU), for example.

What is claimed is:

1. A cooling device comprising a container to which at least one heating element is thermally connected, a primary refrigerant that is sealed in an inside of the container, and a condensation tube through which a secondary refrigerant flows, and which penetrates through a gaseous phase portion in the inside of the container, wherein the heating element is thermally connected to a part where the primary refrigerant in a liquid phase exists or a vicinity of the part where the primary refrigerant in a liquid phase exists, of an outer surface of the container, a container inner surface area increasing portion that increases a contact area with the primary refrigerant in a liquid phase is formed on an inner surface of the container to which the heating element is thermally connected, at least a part of the container inner surface area increasing portion is immersed in the primary refrigerant in a liquid phase, and a plate-shaped member is provided, that includes a shielding portion that is located above the container inner surface area increasing portion in a direction of gravity and below the condensation tube in the direction of gravity, with at least a part of the shielding portion not immersed in the primary refrigerant in a liquid phase, and the shielding portion includes a bent portion bent in the direction of gravity, the bent portion is in contact with the container inner surface area increasing portion, and an edge portion of the shielding portion is in contact with the condensation tube.

2. The cooling device according to claim 1, wherein the container inner surface area increasing portion is a plurality of plate-shaped fins.

3. A cooling device comprising a container to which at least one heating element is thermally connected, a primary refrigerant that is sealed in an inside of the container, and a condensation tube through which a secondary refrigerant flows, and which penetrates through a gaseous phase portion in the inside of the container, wherein the heating element is thermally connected to a part where the primary refrigerant in a liquid phase exists or a vicinity of the part where the primary refrigerant in a liquid phase exists, of an outer surface of the container, a container inner surface area increasing portion that increases a contact area with the primary refrigerant in a liquid phase is formed on an inner surface of the container to which the heating element is thermally connected, at least a part of the container inner surface area increasing portion is immersed in the primary refrigerant in a liquid phase, and a plate-shaped member is provided, that includes a shielding portion that is located above the container inner surface area increasing portion in a direction of gravity and below the condensation tube in the direction of gravity, with at least a part of the shielding portion not immersed in the primary refrigerant in a liquid phase, and the plate-shaped member includes a support portion extending from the shielding portion, in a part of a periphery along an orthogonal direction to the direction of gravity, of the container inner surface area increasing portion, wherein the support portion is integrated with the container inner surface or the container inner surface area increasing portion.

4. A cooling device comprising a container to which at least one heating element is thermally connected, a primary refrigerant that is sealed in an inside of the container, and a condensation tube through which a secondary refrigerant flows, and which penetrates through a gaseous phase portion in the inside of the container, wherein the heating element is thermally connected to a part where the primary refrigerant in a liquid phase exists or a vicinity of the part where the primary refrigerant in a liquid phase exists, of an outer surface of the container, a container inner surface area increasing portion that increases a contact area with the primary refrigerant in a liquid phase is formed on an inner surface of the container to which the heating element is thermally connected, at least a part of the container inner surface area increasing portion is immersed in the primary refrigerant in a liquid phase, and a plate-shaped member is provided, that includes a shielding portion that is located above the container inner surface area increasing portion in a direction of gravity and below the condensation tube in the direction of gravity, with at least a part of the shielding portion not immersed in the primary refrigerant in a liquid phase, and the plate-shaped member includes a support portion extending from the shielding portion, in a part of a periphery along an orthogonal direction to the direction of gravity, of the container inner surface area increasing portion, wherein the support portion is sandwiched by plate-shaped fins.

5. A cooling device comprising a container to which at least one heating element is thermally connected, a primary refrigerant that is sealed in an inside of the container, and a condensation tube through which a secondary refrigerant flows, and which penetrates through a gaseous phase portion in the inside of the container, wherein the heating element is thermally connected to a part where the primary refrigerant in a liquid phase exists or a vicinity of the part where the primary refrigerant in a liquid phase exists, of an outer surface of the container, a container inner surface area increasing portion that increases a contact area with the primary refrigerant in a liquid phase is formed on an inner surface of the container to which the heating element is thermally connected, at least a part of the container inner surface area increasing portion is immersed in the primary refrigerant in a liquid phase, and a plate-shaped member is provided, that includes a shielding portion that is located above the container inner surface area increasing portion in a direction of gravity and below the condensation tube in the direction of gravity, with at least a part of the shielding portion not immersed in the primary refrigerant in a liquid phase, and the plate-shaped member includes a support portion extending from the shielding portion, in a part of a periphery along an orthogonal direction to the direction of gravity, of the container inner surface area increasing portion, wherein the shielding portion includes a shielding portion extension part extended toward a direction of the inner surface of the container from the support portion.

6. A cooling device comprising a container to which at least one heating element is thermally connected, a primary refrigerant that is sealed in an inside of the container, and a condensation tube through which a secondary refrigerant flows, and which penetrates through a gaseous phase portion in the inside of the container, wherein the heating element is thermally connected to a part where the primary refrigerant in a liquid phase exists or a vicinity of the part where the primary refrigerant in a liquid phase exists, of an outer surface of the container, a container inner surface area increasing portion that increases a contact area with the primary refrigerant in a liquid phase is formed on an inner surface of the container to which the heating element is thermally connected, at least a part of the container inner surface area increasing portion is immersed in the primary refrigerant in a liquid phase, and a plate-shaped member is provided, that includes a shielding portion that is located above the container inner surface area increasing portion in a direction of gravity and below the condensation tube in the direction of gravity, with at least a part of the shielding portion not immersed in the primary refrigerant in a liquid phase, and the plate-shaped member includes a support portion extending from the shielding portion, in a part of a periphery along an orthogonal direction to the direction of gravity, of the container inner surface area increasing portion, wherein the support portion includes a first extension part extended toward a direction of the inner surface of the container from the shielding portion.

7. A cooling device comprising a container to which at least one heating element is thermally connected, a primary refrigerant that is sealed in an inside of the container, and a condensation tube through which a secondary refrigerant flows, and which penetrates through a gaseous phase portion in the inside of the container, wherein the heating element is thermally connected to a part where the primary refrigerant in a liquid phase exists or a vicinity of the part where the primary refrigerant in a liquid phase exists, of an outer surface of the container, a container inner surface area increasing portion that increases a contact area with the primary refrigerant in a liquid phase is formed on an inner surface of the container to which the heating element is thermally connected, at least a part of the container inner surface area increasing portion is immersed in the primary refrigerant in a liquid phase, and a plate-shaped member is provided, that includes a shielding portion that is located above the container inner surface area increasing portion in a direction of gravity and below the condensation tube in the direction of gravity, with at least a part of the shielding portion not immersed in the primary refrigerant in a liquid phase, and the plate-shaped member includes a support portion extending from the shielding portion, in a part of a periphery along an orthogonal direction to the direction of gravity, of the container inner surface area increasing portion, wherein the support portion includes a second extension part extended above the shielding portion in the direction of gravity.

8. The cooling device according to claim 2, wherein a ratio of a distance from a tip end of the plate-shaped fin to a surface at a lower side in the direction of gravity, of the shielding portion to a height of the plate-shaped fin is 0 or more and 4.0 or less.

9. The cooling device according to claim 2, wherein a ratio of a width of the shielding portion to a width of the plate-shaped fin is 0.3 or more and 1.5 or less.

* * * * *